United States Patent [19]
Joyce, Jr. et al.

[11] Patent Number: 5,292,559
[45] Date of Patent: Mar. 8, 1994

[54] LASER TRANSFER PROCESS

[75] Inventors: James L. Joyce, Jr., Winston-Salem; Marlin R. McCleaf, Colfax, both of N.C.

[73] Assignee: AMP Incorporated, Harrisburg, Pa.

[21] Appl. No.: 820,443

[22] Filed: Jan. 10, 1992

[51] Int. Cl.$^5$ .................. B05D 3/06; B05D 5/12
[52] U.S. Cl. .................. 427/597; 156/272.8; 427/99; 427/124; 427/125; 427/126.1; 428/620; 428/626; 428/672
[58] Field of Search .............. 156/272.8; 427/42, 53.1, 427/96, 99, 123, 124, 125, 126.1, 597; 428/626, 672, 620

[56] References Cited

U.S. PATENT DOCUMENTS

| | | | |
|---|---|---|---|
| 4,427,498 | 1/1984 | Wagner | 204/26 |
| 4,534,843 | 8/1985 | Johnson et al. | 204/202 |
| 4,666,796 | 5/1987 | Levine | 428/672 X |
| 4,752,455 | 6/1988 | Mayer | 4227/53.1 |
| 4,895,771 | 1/1990 | Souter et al. | 428/672 X |
| 4,929,516 | 5/1990 | Pryor et al. | 428/620 |
| 4,987,006 | 1/1991 | Williams et al. | 427/53.1 |
| 5,066,550 | 11/1991 | Horibe et al. | 428/672 X |

*Primary Examiner*—Arthur L. Corbin
*Attorney, Agent, or Firm*—Timothy J. Aberle; William B. Noll

[57] ABSTRACT

This invention relates to a method for producing a smooth continuous and adherent pressure bonded or cold welded layer of a metal containing composite on a base or target material through the driving force of a pulsed laser. The method includes the steps of selecting a laser transparent substrate, applying thereto a thin laser absorptive polymeric film characterized by a high optical coefficient of absorption to the wavelength of said laser, applying the metal containing composite to the absorptive polymeric film, and placing the base or target material in close proximity to said composite. The composite is a multilayered composite comprising laser absorptive polymer, gold, nickel and gold-flash, and the pulsed laser energy is directed through the transparent substrate toward said composite and is absorbed by the polymeric film causing heating and vaporization thereof while leaving portions of the polymeric film unvaporized. The vaporization provides the necessary pressure to blowoff the unvaporized portions of the absorptive polymeric film so as to propel the composite onto the base or target material.

8 Claims, 1 Drawing Sheet

LASER TRANSFER PROCESS

This invention is directed to an improvement over the process taught in U.S. Pat. No. 4,987,006, more particularly to a unique composite for laser bonding to a substrate having improved adhesion thereto. Such invention has particular utility in the coating, cold welding of foils, or dry plating of copper printed circuit board contacts or selective application to electrical connectors.

BACKGROUND OF THE INVENTION

In the field of plating metal substrates, for example, particularly a process for plating with a precious metal such as gold, selectively controlling the coverage area and thickness of an adherent deposit of such plating metal is a significant cost saving step, often representing the difference between a commercially feasible process and a mere laboratory phenomenon.

The known processes fall into two generally accepted categories: wet plating and dry plating. Electroplating is a wet plating process. The process is most commonly carried out by forming an electrical circuit between the metallic workpiece and a spaced electrode, all while located in a liquid bath containing the material to be plated out. Note U.S. Pat. No. 4,427,498 to Wagner and U.S. Pat. No. 4,534,843 to Johnson, et al.

These conventional electroplating processes can be quite costly and complicated, and can be hazardous both to personal safety and the environment. Waste treatment and disposal are also significant practical problems. Further complications ensue when conventional electroplating is used for selective depositing of the metal onto predetermined areas of the workpiece or to remote areas which may not be electrically connected for conventional plating. For instance, recycling of expensive unused gold can lead to problems.

There are other conventional techniques for depositing a noble metal such as gold on a substrate. Evaporation of gold contacts is in principle a dry plating or deposition alternative to wet electroplating. It is not considered practical, however, because conventional methods require a high vacuum, non-selective deposition of unnecessary gold, which requires extensive recycling, are not easy to turn on and off for spot evaporation without heavily coating a shutter mechanism, and also produces a shadow effect and a poorly defined image. Furthermore, conventional boat evaporation of certain alloy compositions which are required for wear resistance may be difficult. The shortcomings of this technology illustrate the need for a method of metal deposition, in only specifically defined areas, with well-controlled thickness and uniformity, as well as the ability to maintain stoichiometry of the plating alloy.

U.S. Pat. No. 4,987,006, assigned to the assignee hereof, represented a significant breakthrough in the dry plating or cold welding of metals, such as gold and precious metals, onto a substrate. A significant aspect of the aforementioned patent was the recognition of the importance of providing a polymeric film, essentially transparent to the wavelength of the pulsed laser used in the operation, as support for both the metal to be transferred to the substrate and the absorptive polymer. While the process thereof resulted in a smooth and continuous deposited layer, it was discovered that the adhesion of the transferred material, such as gold, was not as effective as desired. Through a combination of a higher, but precise laser energy density window, and a unique multi-layered composite metal foil to be laser bonded, it was discovered that superior adhesion was achieved by the process of this invention. The improved process hereof, and the results achieved thereby, will become more apparent in the description to follow.

SUMMARY OF THE INVENTION

The present invention is directed to a method for producing a smooth continuous and adherent pressure bonded or cold welded layer of gold or metal composite layers on a base material through the driving force of gas and plasma created by the ablation of a UV-absorbing polymer by a pulsed laser. The method hereof represents an improvement to the method originally taught in U.S. Pat. No. 4,987,006, which teaches the steps of selecting a laser transparent substrate, such as quartz, $SiO_2$, Teflon, PTFE or FEP, applying thereto a thin polymeric film, where said polymer is characterized by a high optical coefficient of absorption to the wavelength of said laser, applying the gold or metal composite layers to the polymeric film via evaporation, microwave sputtering, or arc deposition, and placing the substrate material to be transferred onto, or in close proximity to, the polymer mounted gold or metal composite layers. Thereafter, a pulsed laser, such as an excimer laser, is directed through the laser transparent support substrate toward the absorptive polymeric film and metal composite to drive said metal composite to the target or substrate to be plated. The improvement preferably comprises the steps of a) preparing the polymer mounted gold as a multilayered composite comprising polymer, gold, nickel, gold-flash, and b) directing pulsed laser energy at an energy density of between about 8 and 20 $J/cm^2$ through the transparent substrate toward the laser absorptive polymeric film.

DETAILED DESCRIPTION OF THE PREFERRED EMBODIMENT

The present invention is directed to an improved process for laser transfer plating of a material, preferably a metal such as gold or a metal composite, onto a substrate, preferably metallic. The invention hereof, utilizing a UV absorptive polymer layer or film to assist in propelling such plating metal in the form of a unique composite, overcomes many of the shortcomings of prior art selective plating or deposition practices.

Figure 1:
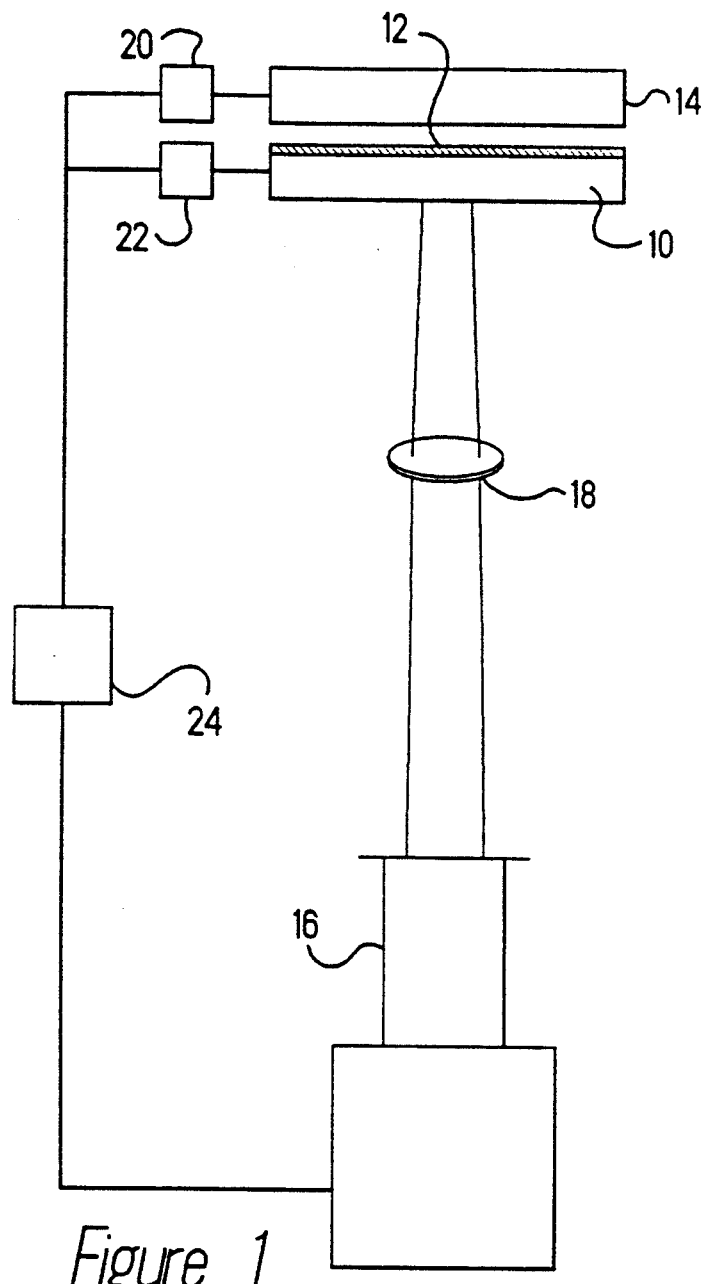
FIG. 1 is a schematic illustrating the process of laser transfer plating according to the present invention.

In the preferred practice of this invention, as illustrated schematically in FIG. 1, a thin laser absorptive polymer carrier film, such as polyimide, is deposited onto a laser-transparent, preferably flexible, substrate, such as polystyrene, polyvinyl acetate, PMMA or polyethylene. Glass, quartz, or sapphire may also be used, but prolonged use or high laser power may result in damage thereto. Further, for cost effectiveness, an expendable carrier or support, such as the laser transparent polymers above, all of which preferably exhibit an optical coefficient of absorption of less than about $10^1$ cm$^{-1}$ at the desired laser wavelength, is preferred.

The metal composite, deposited or coated onto the laser transparent substrate, comprises a first layer of a polymer carrier film adjacent the laser transparent substrate, a second layer of gold, a third metal layer such as nickel or indium, and a final flash layer of gold, where such composite is preferably formed by sputter deposition, evaporation, or arc deposition in a vacuum. Further details on such composite will be offered later.

In practice, the vacuum processed composite, mounted or coated on the laser transparent substrate, is placed near or adjacent the target area, preferably a metal substrate, such as copper or a copper alloy (or nickel), where the gold flash layer is adjacent the target area. Thereafter, a short laser pulse of 20–30 nanoseconds, such as from an excimer laser, is directed towards the laser transparent substrate. The short laser pulse, shaped optically to the desired shape of the deposit then vaporizes a portion of, or the entire, thickness of the laser absorptive polymer carrier film, which is opaque to the laser wavelength. The vapor and plasma which are formed create a pressure blow-off which drives the remainder of the polymer film thickness, if any remains, carrying the metal composite layers, at very high pressure against the target area, causing pressure bonding or cold welding. That is, the expanding vapor drives such remaining absorptive polymer if any, and the metal layers on it onto the target area to be covered, which preferably had been placed adjacent the gold, at a rather high pressure (estimated at about 15 to 20 kilobars). By the use of a high energy density, within a controlled range, as hereinafter explained, it was possible to achieve excellent adhesion and desirable spot shape definition of the composite to the target area. Finally, to the extent that any laser absorptive polymer film remains on the transferred and pressure bonded or cold welder composite, it may be readily removed or stripped by procedures known in the art.

Figure 2:
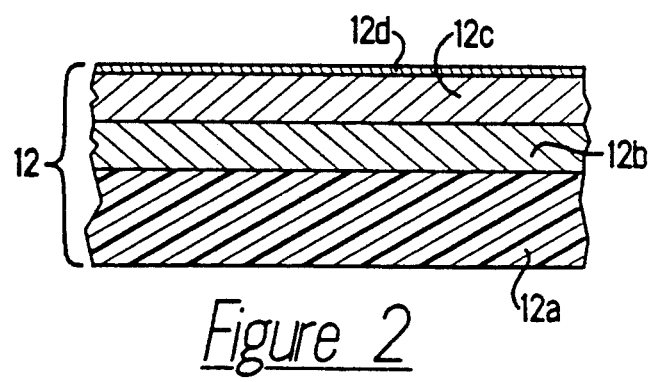
FIG. 2 is an enlarged sectional view illustrating the composite prior to its laser transfer to a target, such as a metal substrate.

Turning now to FIG. 1, the source of material to be transferred is a transparent source plate or substrate 10, namely, one that is transparent to the laser wavelength, bearing the composite 12, as illustrated more clearly in FIG. 2. The composite is formed of a thin polymer film 12a adjacent the substrate 10, and the plural metal layers of gold, nickel and a final flash layer of gold. The gold-flash layer is placed in operative proximity to, i.e. close to or in contact with, a workpiece 14 to be plated. In a preferred embodiment, the workpiece 14 may be an electrically conductive material such as nickel, nickel plated, or other electrically equivalent metal such as copper. The separation of the composite 12 and the workpiece 14 is significantly smaller than the smallest transverse dimension of the pattern to be deposited, and preferably in tight contact. A pulse from a laser 16 incident through the transparent substrate is absorbed by the laser absorptive polymer film. In a preferred embodiment thereof, the resulting energy build-up therein causes the remaining laser absorptive polymer to vaporize thus propelling the composite 12 toward the workpiece 14 to cause pressure bonding or cold welding of the composite 12 to said workpiece 14.

By this practice, vaporization of the metals, particularly the gold are avoided. More precisely, a key aspect of the process hereof is that solid gold of a specified spatial pattern and thickness can be projected at very high velocities onto the workpiece 14, typically nickel or copper, so that pressure bonding at the interface may occur. Since the gold is never vaporized or melted in this case, aspects of structure, such as smoothness, continuity, composition or multiple layers that were present in the noble metal film or composite 12 before transfer, can be maintained.

Continuing with the operational set-up illustrated in FIG. 1, the transverse spatial extent of the composite transfer is defined by the shape and extent of the laser spot illuminating the substrate. The laser spot can be shaped by a mask in the beam path or preferably by an optical or other imaging system 18, as known in the art. The transverse spatial extent of the transferred material is preserved by proximity of source and workpiece. In use, the substrate and workpiece may be clamped in contact for concurrent movement with respect to the laser spot with motor means provided to effect their preprogrammed motion. In the preferred mode of operation, however, the substrate and the workpiece would be preprogrammed for movement with respect to each other for single or multiple transfers, and motor means 20 and 22 would be individually provided to effect the preprogrammed motion. In this embodiment, the laser spot could be moved with respect to one or both of the movable members in the plating zone. A programmable controller 24 is used to coordinate the various motor means as well as the operation and movement of the laser spot. The resulting plated area would thus normally be formed of a series of coterminus transferred dots. In other uses, the laser spot would be preprogrammed for movement with respect to the clamped substrate and workpiece.

Referring now to FIG. 2 which illustrates, in section, a preferred composite 12 for practicing the invention, such composite comprises a thin laser absorptive polymer film 12a which is adapted to lie adjacent the transparent source substrate 10, see FIG. 1. A preferred polymer for use herein is polyimide, having a relatively high optical coefficient of absorption of at least about $2 \times 10^4$ cm$^{-1}$ for an excimer laser operation in the range of about 193 nm to about 351 nm. By the use of such a polymer, the energy generated by a single excimer shot or pulse will be sufficiently absorbed therein causing heating and vaporization of a portion of the absorptive polymer with a build-up of pressure resulting in the remaining or overlying polymer being blown off and propelling the overlying composite 12 toward the workpiece 14 or target area. For more information on other suitable polymers, reference is made to U.S. Pat. No. 4,987,006, wherein the data thereof is incorporated herein by reference.

The layer 12b, adjacent the thin absorptive polymer layer 12a, is gold or other metal or alloy which ultimately becomes the contact area for the composite which is pressure bonded or cold welded to the substrate 14. The layer 12c, intermediate the gold layer 12b and gold flash layer 12d, is a layer of nickel, the major purpose of which is to provide a diffusion barrier between gold layer 12b and the preferred copper or copper alloy substrate 14. That is, the nickel layer 12c prevents the copper, or alloy thereof, from diffusing through to the gold, layer 12b. The purpose of the gold flash layer 12d, having a typical thickness of about 120 angstroms, is present to provide an oxide formation barrier. While gold represents the preferred metal for the flash layer, it should be noted that other metals, such as indium and palladium, which are relatively inert to oxidation may be used. It will be recalled that the composite is formed under vacuum to prevent formation of an oxide layer on the nickel, which under atmospheric conditions would easily and quickly form.

In a series of experiments directing a single pulse of an excimer laser at a quartz substrate having mounted thereon a composite of the type described above, where the energy density was varied over a broad range, it was discovered that there is a critical window, below and above which poor adhesion or image definition results. Data from the experiments are presented in TABLE I, where the composite 12 comprised a polyimide layer 12a of between 0.25 to 2.5 microns, a gold layer 12b of about 1.2 microns, and a gold flash layer 12d of about 120 angstroms. (The nickel layer was not used.)

TABLE I

| Test | Spot Size X (cm) | Y (cm) | Energy Density J/cm$^2$ | Adhesion | Image |
|---|---|---|---|---|---|
| A | 0.1143 | 0.1092 | 8.3 | marginal | poor-distorted edges |
| B | 0.1092 | 0.1016 | 9.4 | good | poor-distorted edges |
| C | 0.0978 | 0.0978 | 10.9 | good | marginal |
| D | 0.0919 | 0.0922 | 12.3 | good | good |
| E | 0.0838 | 0.0889 | 14.0 | better | good |
| F | 0.0762 | 0.0762 | 17.9 | best | superior edge definition |
| G | out of focus | | >18 | acceptable | poor distorted image - poor edge definition |

In U.S. Pat. No. 4,987,006, it was believed that an energy density of 7 J/cm$^2$ was sufficient to effect pressure bonding or cold welding of gold to a copper substrate or workpiece. Through further research, it was discovered that to achieve good adhesion and imaging, i.e. good spot definition, much higher energy densities were required, and that in fact an energy density window existed. Specifically, it was determined that such a window was present for an energy density range of about 8 J/cm$^2$ to about 20 J/cm$^2$, with a preferred smaller window of from about 12 J/cm$^2$ to about 18 J/cm$^2$.

We claim:

1. In a method for producing a smooth continuous and adherent pressure bonded or cold welded layer of a metal containing composite on a base metal through the driving force of a pulsed laser, which includes the steps of selecting a laser transparent substrate, applying to said substrate a thin polymeric film characterized by a high optical coefficient of absorption to the wavelength of said laser, applying said metal containing composite onto said thin polymeric film, and placing said base metal in close proximity to said thin polymeric film containing composite, the improvement comprising in combination therewith the steps of a) preparing said thin polymeric film containing composite as a multilayered composite comprising an absorptive polymer, a metal, nickel and a metal flash layer, and b) directing pulsed laser energy at an energy density of between about 12 and 18 J/cm$^2$ through said transparent substrate toward said thin polymeric film containing composite whereby said laser energy is absorbed by said thin polymeric film causing heating and vaporization of said film to a controlled depth of said film, leaving remaining portions of said film unvaporized after said depth to act as support for said composite to be pressure bonded or cold welded, said vaporization providing the necessary pressure to blowoff said remaining unvaporized portions of said film, thereby propelling said composite onto said base metal.

2. The method according to claim 1 wherein said metal of said metal containing composite is gold, gold alloy, or a plural layered composite containing gold.

3. The method according to claim 1 wherein the metal flash layer is a metal relatively inert to oxidation.

4. The method according to claim 3 wherein the metal relatively inert to oxidation is selected from the group consisting of gold, indium or palladium.

5. The method according to claim 1 wherein the multilayered composite is prepared by sputter deposition in a vacuum.

6. The method according to claim 4 wherein the metal relatively inert to oxidation is gold having a thickness on the order of about 120 angstroms.

7. The method according to claim 1 wherein the multilayered composite is prepared by arc deposition in a vacuum.

8. The method according to claim 1 wherein the multilayered composite is prepared by evaporation in a vacuum.

* * * * *